(12) United States Patent
Sato et al.

(10) Patent No.: US 11,462,449 B2
(45) Date of Patent: Oct. 4, 2022

(54) SEMICONDUCTOR DEVICE

(71) Applicant: NISSAN MOTOR CO., LTD., Yokohama (JP)

(72) Inventors: Hiroshi Sato, Ibaraki (JP); Yoshinori Murakami, Kanagawa (JP); Hidekazu Tanisawa, Ibaraki (JP); Shinji Sato, Ibaraki (JP); Fumiki Kato, Ibaraki (JP); Kazuhiro Mitamura, Ibaraki (JP); Yui Takahashi, Tokyo (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/417,854

(22) PCT Filed: Dec. 26, 2018

(86) PCT No.: PCT/JP2018/047844
§ 371 (c)(1),
(2) Date: Jun. 24, 2021

(87) PCT Pub. No.: WO2020/136759
PCT Pub. Date: Jul. 2, 2020

(65) Prior Publication Data
US 2022/0044980 A1   Feb. 10, 2022

(51) Int. Cl.
*H01L 23/29*   (2006.01)
*H01L 23/31*   (2006.01)
(Continued)

(52) U.S. Cl.
CPC .............. *H01L 23/29* (2013.01); *H01L 23/31* (2013.01); *H01L 33/486* (2013.01);
(Continued)

(58) Field of Classification Search
CPC ..... H01L 33/502; H01L 33/50; H01L 33/501; H01L 33/504; H01L 33/60
See application file for complete search history.

(56) References Cited

U.S. PATENT DOCUMENTS 8,283,686 B2   10/2012   Jagt et al.
9,293,670 B2   3/2016   Toita et al.
(Continued)

FOREIGN PATENT DOCUMENTS

CN   101897040 A   11/2010
CN   106104821 A   11/2016
(Continued)

OTHER PUBLICATIONS

Taguchi, Tsunemasa, "The 21$^{st}$ Century Lighting Based on White Light-Emitting Diodes (LEDs)", Journal of the Illuminating Engineering Institute of Japan, 2001, vol. 85, No. 7, pp. 496-501.
(Continued)

*Primary Examiner* — Marcos D. Pizarro
*Assistant Examiner* — Antonio B Crite
(74) *Attorney, Agent, or Firm* — Foley & Lardner LLP (57) ABSTRACT

A semiconductor device includes a semiconductor chip provided inside with a p-n junction, an opaque sealing resin covering a surface of the semiconductor chip, and a functional region arranged between the semiconductor chip and the sealing resin and configured to prevent light, which is generated when a forward current flows through the p-n junction and has a particular wavelength causing deterioration of the sealing resin, from reaching the sealing resin.

7 Claims, 4 Drawing Sheets

(51) Int. Cl.
*H01L 33/48* (2010.01)
*H01L 33/50* (2010.01)
*H01L 33/62* (2010.01)
*H01L 23/00* (2006.01)
*H01L 33/52* (2010.01)

(52) U.S. Cl.
CPC ............ *H01L 33/502* (2013.01); *H01L 33/62* (2013.01); *H01L 2924/181* (2013.01)

(56) References Cited

U.S. PATENT DOCUMENTS

| | | |
|---|---|---|
| 10,383,963 B2 | 8/2019 | Toita et al. |
| 2006/0220053 A1 | 10/2006 | Furukawa et al. |
| 2010/0258831 A1 | 10/2010 | Jagt et al. |
| 2015/0287894 A1 | 10/2015 | Toita et al. |
| 2016/0033715 A1* | 2/2016 | Lee ................. H01L 33/504 257/89 |
| 2016/0172553 A1 | 6/2016 | Toita et al. |
| 2017/0087262 A1 | 3/2017 | Toita et al. |
| 2017/0200873 A1* | 7/2017 | Nakabayashi ........ H01L 33/005 |
| 2018/0348577 A1 | 12/2018 | Pousthomis et al. |
| 2019/0049760 A1* | 2/2019 | Hyun .................... H05B 47/10 |
| 2019/0123247 A1* | 4/2019 | Isono ................... H01L 33/52 |

FOREIGN PATENT DOCUMENTS

| | | |
|---|---|---|
| EP | 2 223 352 | 9/2010 |
| JP | 56-081957 A | 7/1981 |
| JP | 10-270609 A | 10/1998 |
| JP | 11-354687 A | 12/1999 |
| JP | 2005-317881 A | 11/2005 |
| JP | 2006-310771 A | 11/2006 |
| JP | 2009-99784 A | 5/2009 |
| JP | 2010-219420 A | 9/2010 |
| JP | 2013-062540 A | 4/2013 |
| JP | 2014-120639 A | 6/2014 |
| JP | 2019-29507 A | 2/2019 |
| WO | WO-2009/074919 A1 | 6/2009 |
| WO | WO 2016/162987 A | 10/2016 |

OTHER PUBLICATIONS

Uchiyama, Naoki, "Complete Dry Process Laser Dicing", Journal of the Japan Society of Precision Engineering, 2010, vol. 76, No. 7, pp. 747-750.

Japanese Notice of Reasons for Refusal and English translation, Application No. 2017-147443, dated Feb. 24, 2021, 6 pages.

* cited by examiner

SEMICONDUCTOR DEVICE

TECHNICAL FIELD

The present invention relates to a semiconductor device having a resin-sealed packaged structure in which a semiconductor chip is sealed with resin.

BACKGROUND ART

Semiconductor chips serving as transistors and diodes have the characteristics that are influenced by dirt or static electricity on the surface. A thin metallic wire connecting electrodes arranged on the surface of a semiconductor chip does not have resistance to oscillation when exposed directly on the surface. The semiconductor chip and the circumference thereof are thus typically filled and sealed mainly with resin insulating material, as disclosed in Patent Literature 1, for example.

CITATION LIST

Patent Literature

Patent Literature 1: Japanese Unexamined Patent Application Publication No. 2013-062540
Patent Literature 2: Japanese Unexamined Patent Application Publication No. 2009-099784

Non-Patent Literature

Non-Patent Literature 1: TAGUCHI Tsunemasa, "The 21st Century Lighting Based on White Light-Emitting Diodes (LEDs)"; Journal of the Illuminating Engineering Institute of Japan, 2001, volume 85, No. 7, p. 496-501
Non-Patent Literature 2: UCHIYAMA Naoki, "Complete Dry Process Laser Dicing"; Journal of the Japan Society of Precision Engineering, 2010, volume 76, No. 7, p. 747-750

SUMMARY OF INVENTION

Technical Problem

When a forward current flows through a p-n junction in the semiconductor chip, light having energy corresponding to a band gap of a semiconductor implementing the p-n junction is theoretically generated regardless of a direct band gap type or an indirect band gap type. A band gap of a silicon (Si) semiconductor is 1.12 eV, and a band gap of a gallium arsenide (GaAs) semiconductor is 1.43 eV. The shortest wavelengths of light emitted from the respective semiconductors are 1,107 nm and 867 nm, which are both infrared light. The heat is thus only generated if the sealing resin is irradiated with the generated light.

A band gap of a silicon carbide (SiC) semiconductor is 3.26 eV in the case of 4H type, and a band gap of a gallium nitride (GaN) semiconductor is 3.39 eV, which have been increasingly used as a next-generation semiconductor. The shortest wavelengths of light generated in the respective wide band-gap semiconductors are 380 nm and 366 nm, which are both ultraviolet light exceeding a range of visible light.

Since the ultraviolet light of this type is able to cut out particular molecular bonding of resin, the various properties can be presumed to be deteriorated on a long-term basis depending on the type of resin used for sealing the semiconductor chip. With regard to a light-emitting device using a light-emitting diode (LED) as a light source including a wide band-gap semiconductor, for example, a measure has been proposed that converts the ultraviolet light to visible light by use of a fluorescent substance, and further avoids the deterioration of the sealing resin caused by the ultraviolet light not converted (refer to Patent Literature 2).

A power semiconductor device using a wide band-gap semiconductor is conventionally packaged by resin sealing while not taking account of the above problem of the ultraviolet light. The reason for this is that a transistor intended to be put to practical use in the SiC semiconductor or the GaN semiconductor is a unipolar device such as a MOSFET, and a forward current does not flow through the internal p-n junction in a normal operation, which causes no ultraviolet light.

However, the inventors found out that a forward current flows in a parasitic p-n diode present in such a unipolar device depending on a driving means, and ultraviolet light is thus frequently generated. A packaged structure using a sealing resin designed without taking account of this problem could be deteriorated sightly earlier than expected in terms of the properties such as adhesiveness between the semiconductor chip and the sealing resin due to the generated ultraviolet light. A bipolar device such as an IGBT using a wide band-gap semiconductor, which has been studied so as to be put to practical use in the near future, also has the same problem since ultraviolet light is generated during the original operation. Further, since the sealing resin in the packaged structure of the power semiconductor is opaque to the ultraviolet light, which is different from the packaged structure of the LED, the ultraviolet light generated all has the influence on the molecular bonding of the sealing resin.

In view of the foregoing problems, the present invention provides a semiconductor device having a packaged structure capable of preventing deterioration of a sealing resin caused by light generated in a p-n junction of a semiconductor chip so as to ensure a long-term reliability.

Solution to Problem

A semiconductor device according to an aspect of the present invention includes a functional region arranged between a semiconductor chip and a sealing resin and configured to prevent a light from reaching the sealing resin, the light being generated in a p-n junction of the semiconductor chip and having a wavelength causing deterioration of the sealing resin.

Advantageous Effects of Invention

The present invention can provide a semiconductor device having a packaged structure capable of preventing deterioration of a sealing resin caused by a light generated in a p-n junction of a semiconductor chip so as to ensure a long-term reliability.

DESCRIPTION OF EMBODIMENTS

Hereinafter, embodiments according to the present invention are described with reference to the drawings. The same or similar elements illustrated in the drawings are denoted by the same or similar reference numerals. It should be understood that the drawings are illustrated schematically, and the respective dimensions and vertical and lateral proportions in the drawings are not drawn to scale. It should also be understood that the dimensional relationships and proportions between the respective drawings can differ from each other.

First Embodiment

Figure 1:
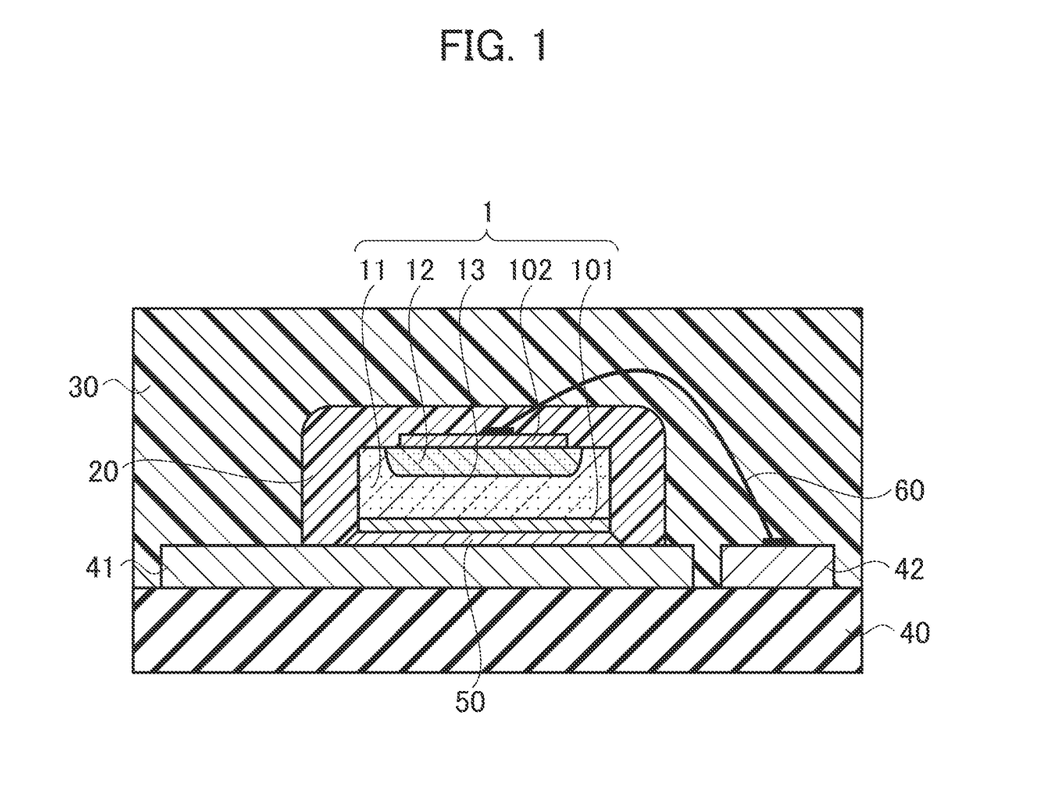
FIG. 1 is a schematic cross-sectional view illustrating a structure of a semiconductor device according to a first embodiment of the present invention.

FIG. 1 is a schematic cross-sectional view illustrating a semiconductor device according to a first embodiment of the present invention. Reference numeral 1 shown in the drawings indicates a semiconductor chip including a wide band-gap semiconductor such as SiC or GaN particularly having a wide band gap that corresponds to a wavelength of light corresponding to ultraviolet light. To simplify the explanations of the present invention, the first embodiment is illustrated with a case in which the semiconductor chip 1 is a vertical p-n diode chip. It should be understood that the present invention can achieve the similar effects also in a case of using a semiconductor chip such as a MOSFET, a bipolar transistor, and an IGBT. The semiconductor chip 1 is provided with a p-n junction 13 such that a semiconductor region 12 of p-type is deposited on the surface of a semiconductor region 11 of n-type serving as a base body. The semiconductor chip 1 also includes a first main electrode 101 on the rear surface serving as a cathode. The semiconductor chip 1 further includes a second main electrode 102 on the front surface serving as an anode connected to the p-type semiconductor region 12. While the n-type semiconductor region 11 actually includes a high-concentration region occupying the most part and a low-concentration region arranged in layers only adjacent to the p-type semiconductor region 12, the respective drawings simply illustrate the semiconductor region 11 without being defined by the respective regions for illustration purposes.

The semiconductor chip 1 is packaged on a metallic wiring layer provided on a substrate 40 having an insulating property. A first wiring pattern 41 illustrated in FIG. 1 is a cathode wiring layer arranged on the top surface of the substrate 40. The first main electrode 101 provided on the main surface of the semiconductor chip 1 opposed to the top surface of the substrate 40 is electrically and physically connected to the first wiring pattern 41 via a bonding member 50 made of metal by soldering, for example. The second main electrode 102 is electrically connected to a second wiring pattern 42 provided on the substrate 40 separately from the first wiring pattern 41 via a metal wire 60. The metal wire 60 is made of an alloy mainly including aluminum, for example, and is bonded to the surface of the metal included in the second main electrode 102 and the surface of the metal included in the second wiring pattern 42 principally by ultrasonic bonding.

The packaged structure as described above is covered with a sealing resin 30 as illustrated in FIG. 1 so as to avoid deterioration in performance of the semiconductor chip 1 caused by external dirt, and ensure oscillation resistance of the metal wire 60. The sealing resin 30 used typically is a black-colored opaque epoxy resin, for example. The packaged structure illustrated in FIG. 1 further includes a functional insulating film 20 between the semiconductor chip 1 and the sealing resin 30. The functional insulating film is a form of the element referred to above as the "functional region" in "SOLUTION TO PROBLEM" of the present specification. When a forward current flows in the p-n junction 13 in the semiconductor chip 1 including the wide band-gap semiconductor, ultraviolet light, which is able to cut out the molecular bonding of an organic compound composing the sealing resin 30, is generated (referred to below as "generated. light"). The functional insulating film 20 that is a kind of the "functional region" described above has the function of suppressing damage to the molecular bonding.

The function of the functional insulating film 20 is described below.

The functional insulating film 20 used herein is made of a resin including a fluorescent substance, for example. The fluorescent substance has the properties that, when receiving a light having a short wavelength, converts part of the energy into heat and emits a light having a long wavelength. The fluorescent substance included in the functional insulating film 20 is thus chosen from material that converts the ultraviolet light generated in the p-n junction 13 in the semiconductor chip 1 into a light harmless to the sealing resin 30 such as visible light. The fluorescent substance of this type is a material used for implementing a LED that emits red, green, and yellow lights by use of an ultraviolet LED or a blue LED, or used when combining plural fluorescent substances to emit light having a plurality of wavelengths to implement a white LED device (refer to Non-Patent Literature 1).

A base body of the functional insulating film 20 is made of material chosen from organic material having resistance to the generated light and suitably used for covering the entire semiconductor chip 1 deposited on the substrate 40 as illustrated in FIG. 1. For example, the material is chosen from aromatic polyimide that can be formed into a uniform film by spraying as illustrated in FIG. 1, and hardly reacts to the ultraviolet light generated in the p-n junction 13. Alternatively, ultraviolet-curable resin that causes a polymerization reaction by irradiation with ultraviolet light can be used as the base body of the functional insulating film 20, since the ultraviolet-curable resin does not result in serious deterioration if continuously irradiated with the ultraviolet light after the completion of the polymerization, as compared with other types of resin. Further, heat-resistant silicone can also be used as the base body of the functional insulating film 20, since bonding energy of the molecular bonding associated with silicon is typically higher than that associated with carbon.

A film thickness of the functional insulating film 20 is set to be sufficiently greater than the wavelength of the generated light. The film thickness is preferably set to be at least several times as large as the wavelength.

As described above, the semiconductor device according to the first embodiment of the present invention includes the functional insulating film 20 arranged between the semiconductor chip 1 and the sealing resin 30 so as to prevent the light having a particular wavelength and causing the deterioration of the sealing resin 30 from reaching the sealing resin 30. The semiconductor device as illustrated in FIG. 1 thus can avoid or reduce the deterioration of the sealing resin 30 regardless of whether the semiconductor chip 1 including the wide band-gap semiconductor internally emits the ultraviolet light during its operation, for example. This can extend the life span of the semiconductor device in which the semiconductor chip 1 including the wide band-gap semiconductor is packaged to a preferred period of time, while using the conventionally-used resin as the sealing resin 30 that exhibits sufficient performance in various aspects and has the advantage of reducing costs.

Figure 2:
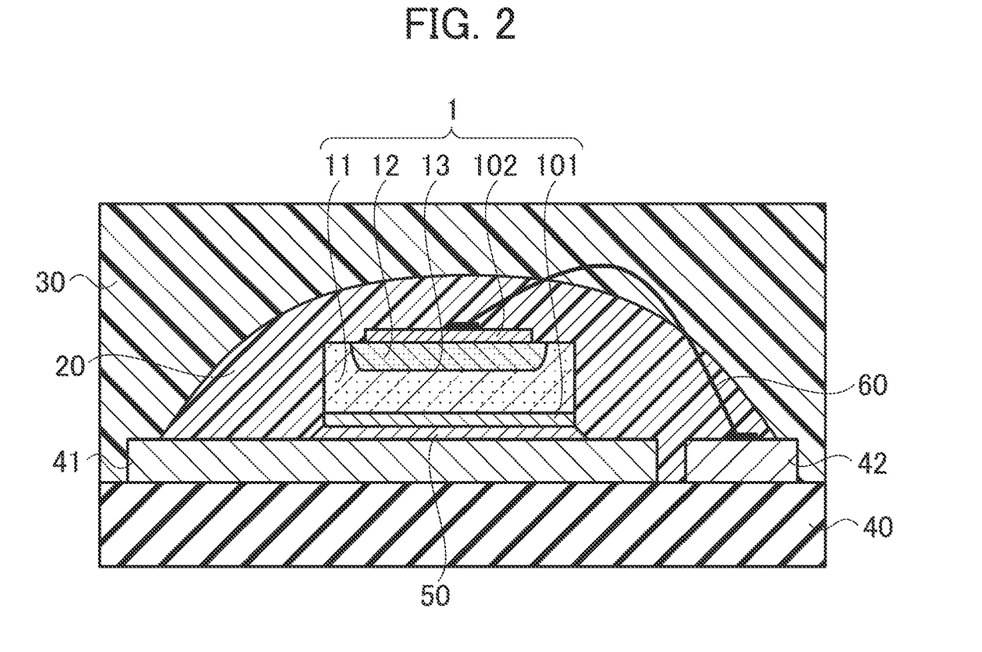
FIG. 2 is a schematic cross-sectional view illustrating another structure of the semiconductor device according to the first embodiment of the present invention.

While FIG. 1 illustrates the semiconductor device with the case of including the functional insulating film 20 having a substantially uniform thickness and arranged on the top and the side surfaces of the semiconductor chip 1, the functional insulating film 20 is not limited to the configuration as illustrated in FIG. 1. For example, as illustrated in FIG. 2, the functional insulating film 20 may be arranged into a liquid-drop state potted on the top surface of the substrate 40 (the same is also applied to the following modified examples).

First Modified Example

Figure 3:
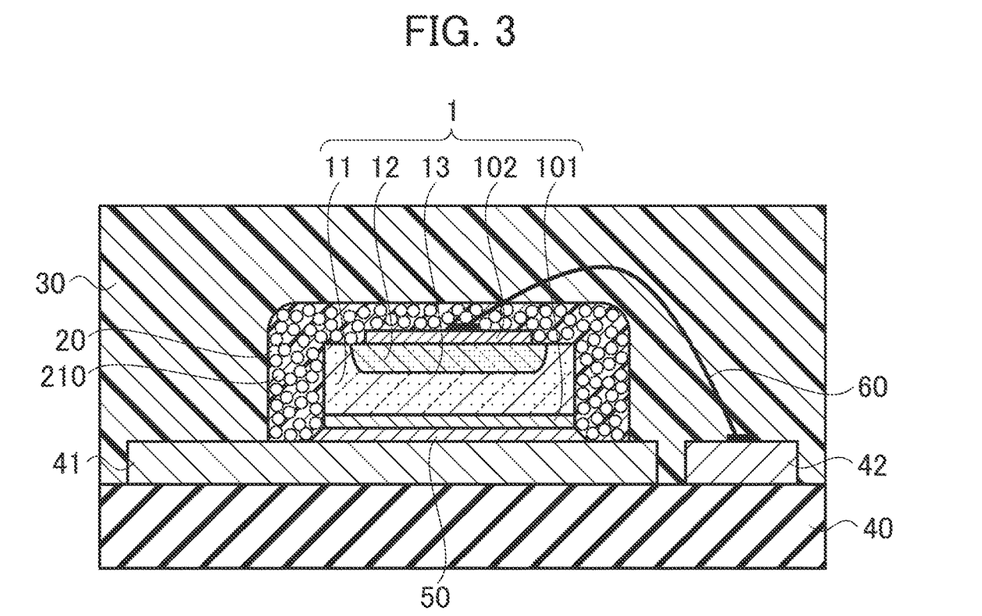
FIG. 3 is a schematic cross-sectional view illustrating a structure of a semiconductor device according to a first modified example of the first embodiment of the present invention.

A first modified example of the first embodiment is described below with reference to FIG. 3. FIG. 3 illustrates the functional insulating film 20 including a large amount of microcrystal particles 210 composed of a conductor having the same band gap as or a narrower band gap than the semiconductor composing the semiconductor chip 1.

The microcrystal particles 210 include a large amount of crystal defects, which form various levels in the band gap. When the generated light enters the microcrystal particles 210, a light having a longer wavelength is emitted, as in the case of the fluorescent substance described above. The functional insulating film 20 including a large amount of the microcrystal particles 210 thus has the same function as the fluorescent substance.

A constituent substance of the microcrystal particles 210 can be the same as that of the semiconductor chip 1. Alternatively, a material having a narrower band gap, such as microcrystals of Si inexpensive and easily available, may be used. A diameter of the microcrystal particles 210 is preferably set to be sufficiently greater than the wavelength of the light emitted from the semiconductor chip 1. A density of the microcrystal particles 210 in the functional insulating film 20 is designed so as not to allow the generated light to directly pass through the functional insulating film 20 without hitting the microcrystal particles 210. The microcrystal particles 210 are preferably formed in multiple layers in the functional insulating film 20, as illustrated in FIG. 3.

As described above, the functional insulating film 20 including the microcrystal particles 210 can also achieve the same effects as described above with reference to FIG. 1.

The configuration illustrated in FIG. 3 does not necessarily include the fluorescent substance, and can make use of the microcrystal particles composed of the semiconductor of the same type as the semiconductor chip 1 or the inexpensive microcrystal particles such as Si. The functional insulating film 20 can include the same fluorescent substance as illustrated in FIG. 1 with no limitation.

Resin typically has a greater coefficient of thermal expansion than a semiconductor. Using the microcrystal particles 210 including the semiconductor in the sealing resin 30 can relax thermal stress caused between the semiconductor chip 1 and the functional insulating film 20 because of a change in temperature during use. The configuration illustrated in FIG. 3 is also suitably used so as to avoid damage caused by the thermal stress.

Second Modified Example

Figure 4:
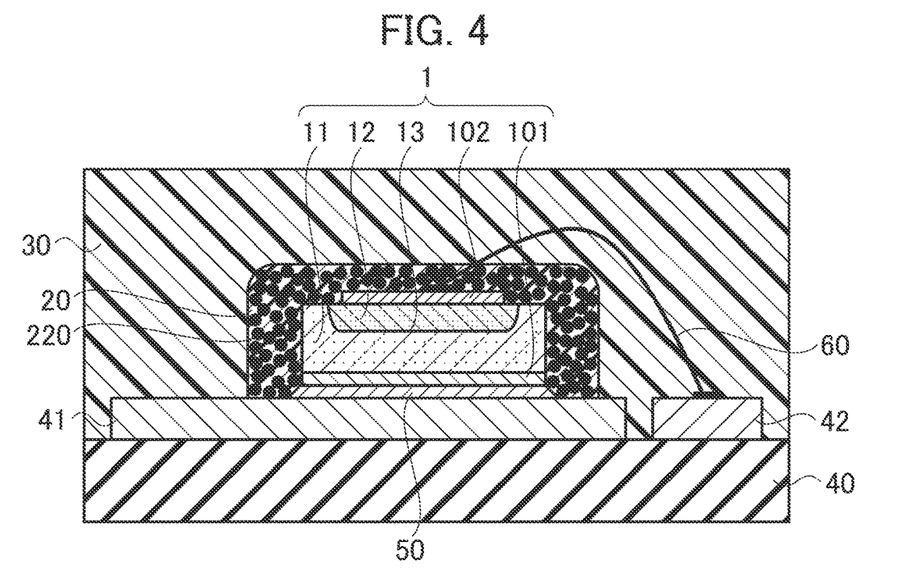
FIG. 4 is a schematic cross-sectional view illustrating a structure of a semiconductor device according to a second modified example of the first embodiment of the present invention.

A second modified example of the first embodiment is described below with reference to FIG. 4. FIG. 4 is a cross-sectional view similar to FIG. 1. The functional insulating film 20 illustrated in FIG. 4 includes reflective particles including a substance at least on the surface that reflects the ultraviolet light emitted from the semiconductor chip 1. A density of the reflective particles 220 in the functional insulating film 20 is also designed to be formed at least in multiple layers in the functional insulating film 20 as illustrated in FIG. 4 so as not to allow the light generated in the semiconductor chip 1 to directly pass through the functional insulating film 20 without hitting the reflective particles 220, as in the case illustrated in FIG. 3.

A constituent substance of the reflective particles 220 to be used is preferably zinc oxide or titanium oxide, for example. Since these substances have electrical conductivity, an insulating component of the functional insulating film 20 should be interposed between the respective reflective particles 220.

A particle diameter and a deposited thickness of the reflective particles 220 are designed so as not to allow the generated light to reach the sealing resin 30, as in the case of the first modified example. The particle diameter of the reflective particles 220 is preferably set to be greater than the wavelength of the generated light.

As described above, the functional insulating film 20 including the reflective particles 220 that reflect the generated light can also achieve the effect of not allowing the generated light to reach the sealing resin 30. The functional insulating film 20 including the reflective particles 220 also may further include the fluorescent substance.

Third Modified Example

Figure 5:
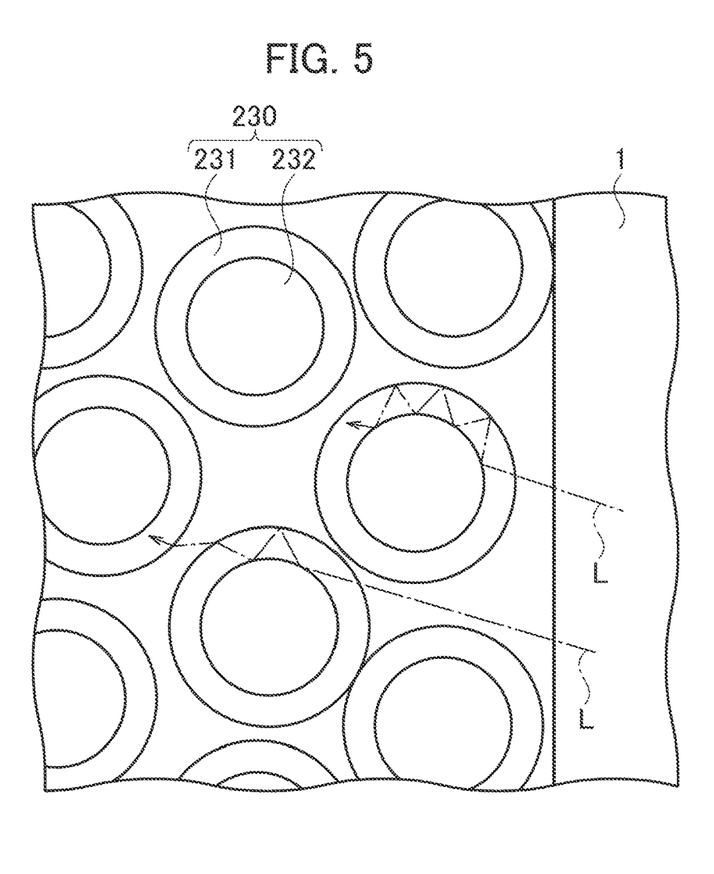
FIG. 5 is a schematic cross-sectional view illustrating a structure of a semiconductor device according to a third modified example of the first embodiment of the present invention.

A third modified example of the first embodiment is described below with reference to FIG. 5. FIG. 5 is a partly-enlarged cross-sectional view of the functional insulating film 20 adjacent to the semiconductor chip 1. The functional insulating film 20 illustrated in FIG. 5 includes fluorescent microparticles 230, each including a particulate base body 232 having a substantially spherical shape, and a fluorescent layer 231 covering the surface of the particulate base body 232.

The particulate base body 232 is made of a material having a higher refractive index than the functional insulating film 20. Choosing such a material for the particulate base body 232 causes the generated light L entering the surface of the respective fluorescent microparticles 230 at a shallow angle to advance in the fluorescent layer 231 including the fluorescent substance while being repeatedly refracted at the interfaces. The functional insulating film 20 including the fluorescent microparticles 230 can efficiently convert the wavelength of the generated light L.

The particulate base body 232 thus preferably has the substantially spherical shape, instead of a shape provided with an acute angle part. The particulate base body 232 may be made of any material that can suppress great deterioration when absorbing the generated light L. The particulate base body 232 may be made of the same material as the microcrystal particles 210 and the reflective particles 220, or may be made of a different material. The fluorescent layer 231 preferably has a thickness set to be greater than the wavelength of the generated light L.

In view of the coefficient of thermal expansion as in the case illustrated in FIG. 3, the material included in the particulate base body 232 is preferably a substance having a small coefficient of thermal expansion, such as quartz glass having a low thermal-expansion coefficient, which is conventionally mixed in a sealing resin of a power semiconductor package, for example. The configuration as described above can provide the functional region while using a lower-priced material than the microcrystal particles 210 as described with reference to FIG. 3.

Second Embodiment

Figure 6:
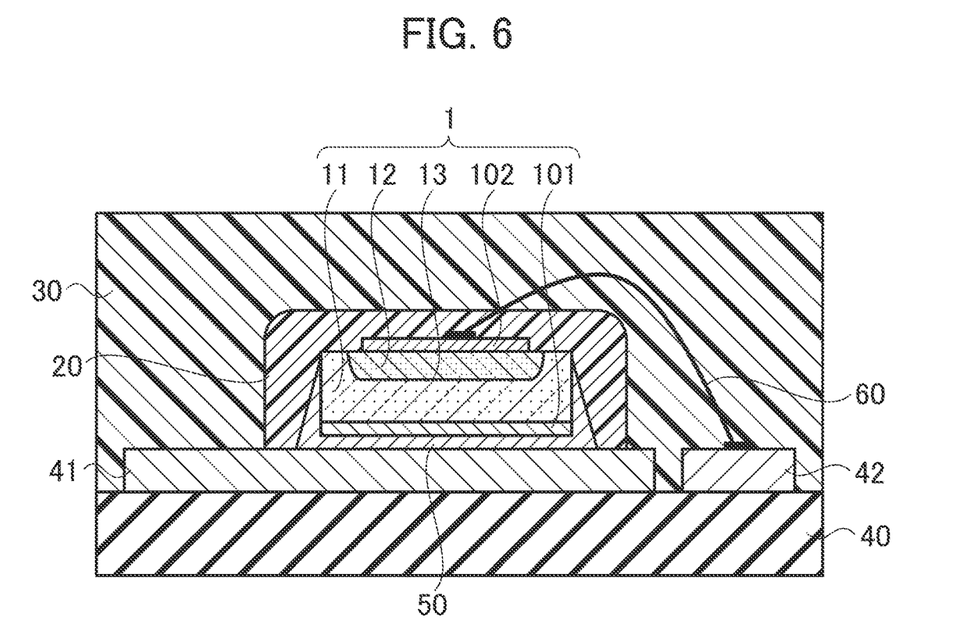
FIG. 6 is a schematic cross-sectional view illustrating a structure of a semiconductor device according to a second embodiment of the present invention.

A second embodiment of the present invention is described below with reference to FIG. 6. FIG. 6 is a cross-sectional view of a semiconductor device similar to that illustrated in FIG. 1. The semiconductor device of this embodiment differs from that of the above embodiment in that the bonding member 50 further extends between the side surface of the semiconductor chip 1 and the functional insulating film 20.

When the bonding member 50 includes a ZnAl material, Zn in the solid ZnAl material when melted evaporates at a melding point or higher to turn into vapor, and adheres to the side surface of the semiconductor chip 1. The molten ZnAl material comes up along the side surface of the semiconductor chip 1 and is then solidified. A metal film of the ZnAl material included in the bonding member 50 is thus formed on the side surface of the semiconductor chip 1 as illustrated in FIG. 6, so as to have a function of reflecting the generated light.

Third Embodiment

Figure 7:
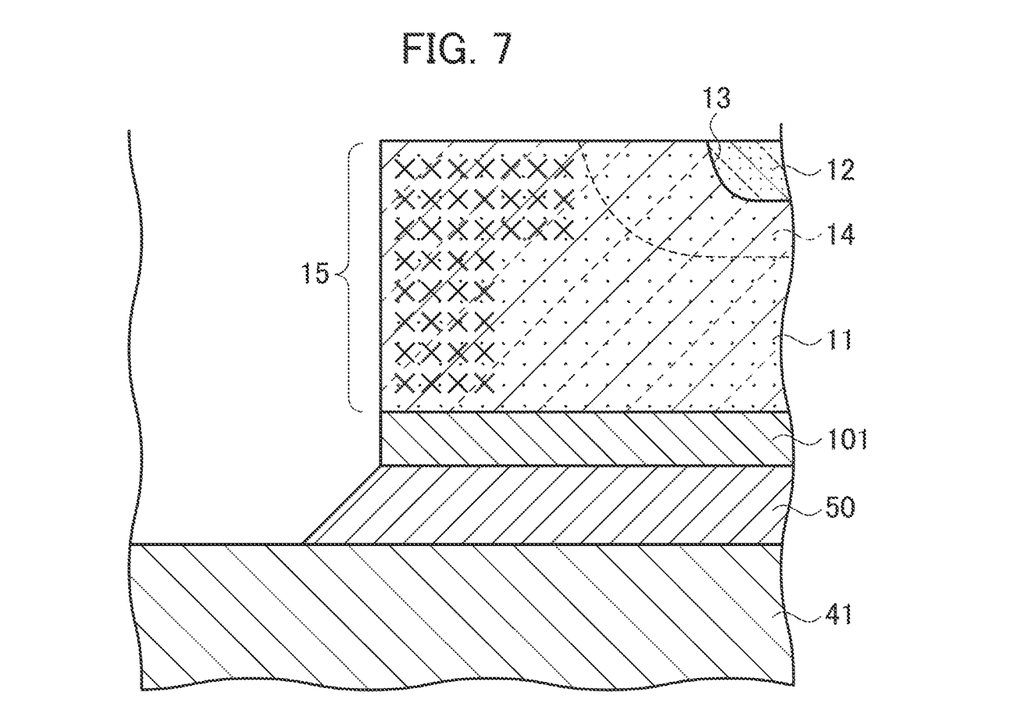
FIG. 7 is a schematic cross-sectional view illustrating a structure of a semiconductor device according to a third embodiment of the present invention.

A third embodiment is described below with reference to FIG. 7. FIG. 7 is an enlarged cross-sectional view illustrating only the part adjacent to the left side surface of the semiconductor chip 1 illustrated in FIG. 1. FIG. 7 omits the illustration of the other elements including the sealing resin 30. The mark "x" indicates a polycrystal region 15 formed in an inactive region adjacent to the side wall of the semiconductor chip 1. The term "inactive region" as used herein refers to a region not serving as a current path during the operation of the semiconductor chip 1, and a region having no influence on a breakdown voltage upon reverse bias of the semiconductor chip 1. In particular, the region is located at the circumference of the side wall of the semiconductor chip 1.

The polycrystal region 15 can be formed by use of a convergent pulse laser typically used for a laser stealth dicing method. The use of the convergent pulse laser can form the polycrystal region locally at an optional position in the semiconductor (refer to Non-Patent Literature 2). The object of the laser stealth dicing is to form a number of belt-like defect regions by this method so as to divide the semiconductor chip into parts with a relatively light external force. The present embodiment uses this method to locally form, in the semiconductor chip 1, crystal defect regions having the same function as the fluorescent substance, as in the case of the microcrystal particles 210 described with reference to FIG. 3. Reducing the laser output and forming multiple layers by local radiation at appropriate intervals can form a region that converts the ultraviolet light emitted from the inside of the semiconductor chip 1 into a harmless light while avoiding unintended deterioration in mechanical strength. The provision of the polycrystal region 15 in the semiconductor chip 1 can eliminate the functional insulating film 20 or can serve as a part of the function thereof, so as to ensure the effect of suppressing the deterioration of the sealing resin more easily.

Other Embodiments

The respective embodiments described above with reference to the drawings may be implemented independently, or may be combined and brought into operation simultaneously. It should be understood that the present invention includes any other embodiments other than the embodiments disclosed herein within the scope of the appended claims.

While the embodiments have been illustrated above with the diode chip of the wide band-gap semiconductor as the semiconductor chip 1, the present invention can also be effectively applied to a packaged structure of a MOSFET, a JFET, a bipolar transistor, an IGBT, or a thyristor that includes a p-n junction and allows a forward current to flow therethrough.

INDUSTRIAL APPLICABILITY

The semiconductor device according to the present invention can be used in electronics industries including manufacturing industries for manufacturing semiconductor devices having a resin-sealed packaged structure in which a semiconductor chip is sealed with resin.

REFERENCE SIGNS LIST

1 SEMICONDUCTOR CHIP
11 n-TYPE SEMICONDUCTOR REGION
12 p-TYPE SEMICONDUCTOR REGION
13 p-n JUNCTION
14 DEPLETION LAYER
15 POLYCRYSTAL REGION
20 FUNCTIONAL INSULATING FILM
30 SEALING RESIN
40 SUBSTRATE
41 FIRST WIRING PATTERN
42 SECOND WIRING PATTERN
50 BONDING MEMBER
60 METAL WIRE
101 FIRST MAIN ELECTRODE
102 SECOND MAIN ELECTRODE
210 MICROCRYSTAL PARTICLE
220 REFLECTIVE PARTICLE
230 FLUORESCENT PARTICLE
231 FLUORESCENT LAYER
232 PARTICULATE BASE BODY

The invention claimed is:
1. A semiconductor device comprising:
a semiconductor chip provided inside with a p-n junction;

an opaque sealing resin covering a surface of the semiconductor chip; and a functional region arranged between the semiconductor chip and the sealing resin and configured to prevent a light from reaching the sealing resin, the light being generated when a forward current flows through the p-n junction and having a particular wavelength causing deterioration of the sealing resin, wherein the functional region includes a functional insulating film having an insulating property and arranged between the semiconductor chip and the sealing resin, and the functional insulating film includes a fluorescent substance that converts the light having the particular wavelength into a light having a long wavelength.

2. The semiconductor device according to claim 1, further comprising:

a substrate on which the semiconductor chip is mounted; and a bonding member including metal and electrically bonding a wiring pattern arranged on a top surface of the substrate with an electrode provided on a main surface of the semiconductor chip opposed to the top surface of the substrate, wherein the bonding member continuously extends along a side surface of the semiconductor chip.

3. A semiconductor device comprising:

a semiconductor chip provided inside with a p-n junction;

an opaque sealing resin covering a surface of the semiconductor chip; and a functional region arranged between the semiconductor chip and the sealing resin and configured to prevent a light from reaching the sealing resin, the light being generated when a forward current flows through the p-n junction and having a particular wavelength causing deterioration of the sealing resin, wherein the functional region includes a functional insulating film having an insulating property and arranged between the semiconductor chip and the sealing resin, and the functional insulating film includes a fluorescent microparticle including a fluorescent substance that converts the light having the particular wavelength into a light having a long wavelength and covers a surface of a particulate base body having a higher refractive index than the functional insulating film.

4. The semiconductor device according to claim 3, wherein the particulate base body has a smaller coefficient of thermal expansion than a base body of the functional insulating film.

5. The semiconductor device according to claim 3, further comprising:

a substrate on which the semiconductor chip is mounted; and a bonding member including metal and electrically bonding a wiring pattern arranged on a top surface of the substrate with an electrode provided on a main surface of the semiconductor chip opposed to the top surface of the substrate, wherein the bonding member continuously extends along a side surface of the semiconductor chip.

6. A semiconductor device comprising:

a semiconductor chip provided inside with a p-n junction;

an opaque sealing resin covering a surface of the semiconductor chip; and a functional region arranged between the semiconductor chip and the sealing resin and configured to prevent a light from reaching the sealing resin, the light being generated when a forward current flows through the p-n junction and having a particular wavelength causing deterioration of the sealing resin, wherein the functional region includes a functional insulating film having an insulating property and arranged between the semiconductor chip and the sealing resin, and the functional insulating film includes a microcrystal particle including a semiconductor having a band gap equal to or narrower than a semiconductor included in the semiconductor chip.

7. The semiconductor device according to claim 6, further comprising:

a substrate on which the semiconductor chip is mounted; and a bonding member including metal and electrically bonding a wiring pattern arranged on a top surface of the substrate with an electrode provided on a main surface of the semiconductor chip opposed to the top surface of the substrate, wherein the bonding member continuously extends along a side surface of the semiconductor chip.

* * * * *